(12) United States Patent
Takehara et al.

(10) Patent No.: US 9,761,766 B2
(45) Date of Patent: Sep. 12, 2017

(54) CHIP ON BOARD TYPE LED MODULE

(71) Applicant: Panasonic Intellectual Property Management Co., Ltd., Osaka (JP)

(72) Inventors: Kosuke Takehara, Osaka (JP); Hisaki Fujitani, Kyoto (JP); Naoki Tagami, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/013,457

(22) Filed: Feb. 2, 2016

(65) Prior Publication Data
US 2016/0260871 A1 Sep. 8, 2016

(30) Foreign Application Priority Data
Mar. 4, 2015 (JP) ................. 2015-042724

(51) Int. Cl.
*H01L 33/50* (2010.01)
*H01L 33/56* (2010.01)
(Continued)

(52) U.S. Cl.
CPC ............ *H01L 33/502* (2013.01); *H01L 33/50* (2013.01); *H01L 33/56* (2013.01); *H01L 33/60* (2013.01);
(Continued)

(58) Field of Classification Search
CPC ....... H01L 33/502; H01L 33/56; H01L 33/62; H01L 33/60; H01L 33/20; H01L 33/54; H01L 33/44
(Continued)

(56) References Cited

U.S. PATENT DOCUMENTS

2003/0230757 A1* 12/2003 Suehiro ................ H01L 33/508
257/99
2007/0080636 A1* 4/2007 Lee ....................... H05B 33/04
313/512
(Continued)

FOREIGN PATENT DOCUMENTS

JP 2006-278830 A 10/2006
JP 2008-140934 A 6/2008
(Continued)

*Primary Examiner* — Allen Parker
*Assistant Examiner* — Didarul Mazumder
(74) *Attorney, Agent, or Firm* — McDermott Will & Emery LLP

(57) ABSTRACT

An LED module includes a mount board and an LED chip. The mount board includes: an insulation substrate that includes resin and glass; a first conductor, a second conductor and a third conductor; and a white resist layer. The white resist layer is provided with a first opening, a second opening and at least one third opening for exposing the first conductor, the second conductor and the third conductor, respectively. The LED module further includes a wavelength conversion layer disposed between the LED chip and the third conductor in a thickness direction of the LED chip. The wavelength conversion layer includes phosphor particles that are excited by first light emitted from the LED chip to emit second light having wavelengths greater than wavelengths of the first light.

11 Claims, 6 Drawing Sheets

(51) Int. Cl.
    *H01L 33/62*     (2010.01)
    *H01L 33/60*     (2010.01)
    *H01L 33/20*     (2010.01)
    *H01L 33/54*     (2010.01)
    *H01L 33/44*     (2010.01)
    *H01L 25/075*     (2006.01)
    *H05K 1/02*     (2006.01)

(52) U.S. Cl.
    CPC .......... *H01L 33/62* (2013.01); *H01L 25/0753* (2013.01); *H01L 2224/45144* (2013.01); *H01L 2224/48091* (2013.01); *H01L 2224/48228* (2013.01); *H01L 2224/49107* (2013.01); *H01L 2224/73265* (2013.01); *H05K 1/0274* (2013.01); *H05K 2201/10106* (2013.01)

(58) Field of Classification Search
    USPC .......................................................... 257/98
    See application file for complete search history.

(56) References Cited

U.S. PATENT DOCUMENTS

| | | | |
|---|---|---|---|
| 2010/0044735 A1* | 2/2010 | Oyamada | H01L 33/504 257/98 |
| 2011/0132644 A1 | 6/2011 | Nishi et al. | |
| 2012/0243261 A1 | 9/2012 | Yamamoto et al. | |
| 2013/0043504 A1* | 2/2013 | Kobayakawa | H01L 33/62 257/99 |
| 2013/0106279 A1* | 5/2013 | Hayashida | H01L 25/0753 313/512 |
| 2014/0117388 A1* | 5/2014 | Kuo | H01L 33/54 257/98 |

FOREIGN PATENT DOCUMENTS

| | | |
|---|---|---|
| JP | 2009-130234 A | 6/2009 |
| JP | 2012-204370 A | 10/2012 |
| JP | 2012-227293 A | 11/2012 |
| JP | 2014-170947 A | 9/2014 |
| WO | 2009/145109 A1 | 12/2009 |

\* cited by examiner

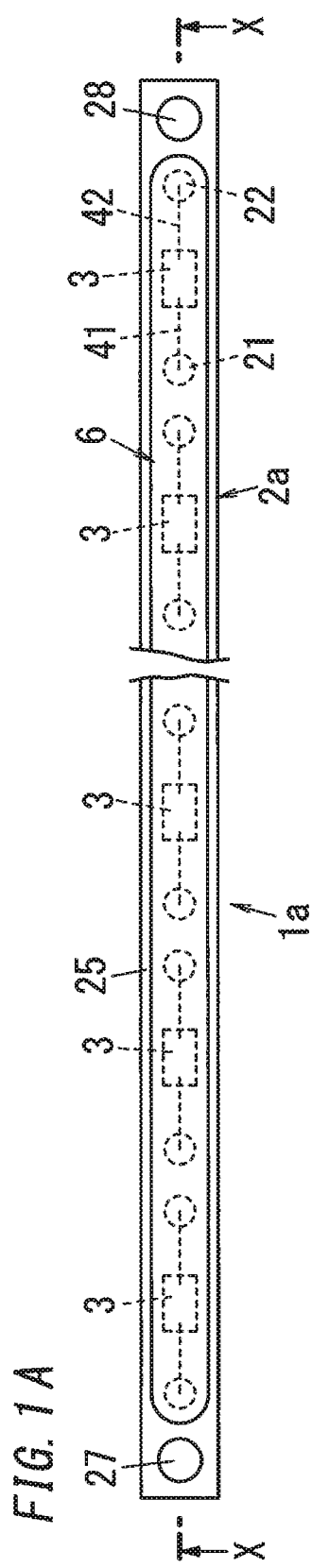
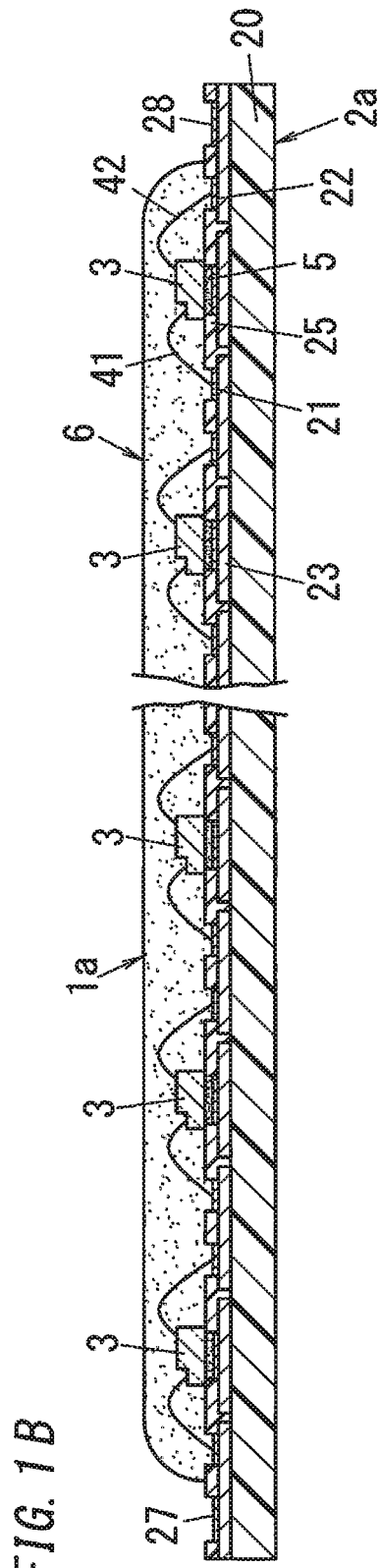
FIG. 1A
FIG. 1B

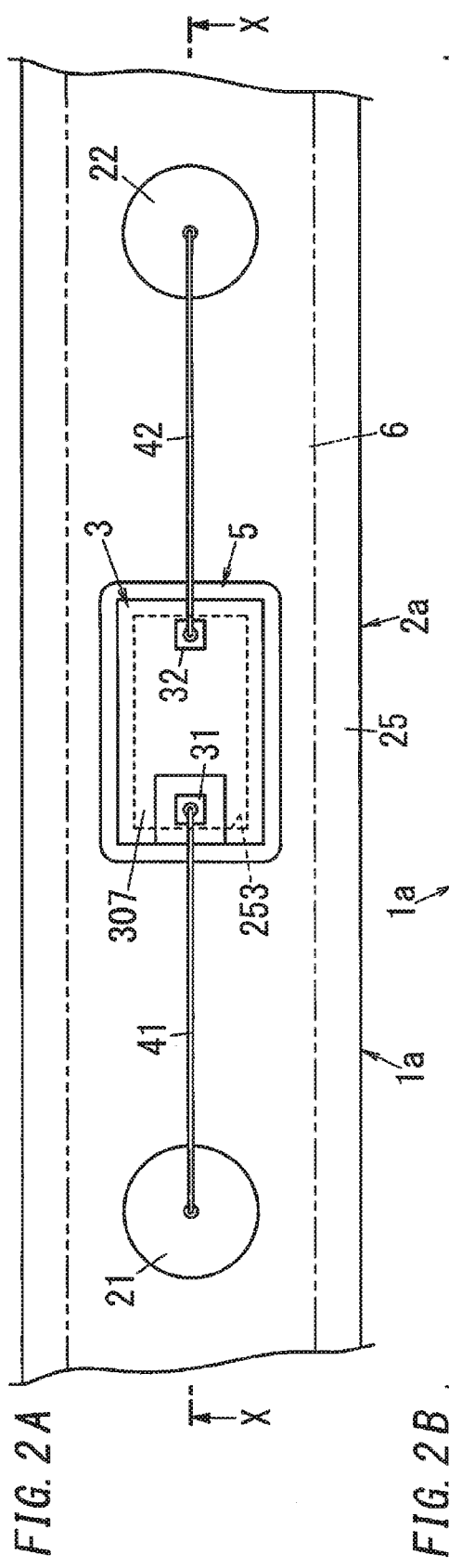
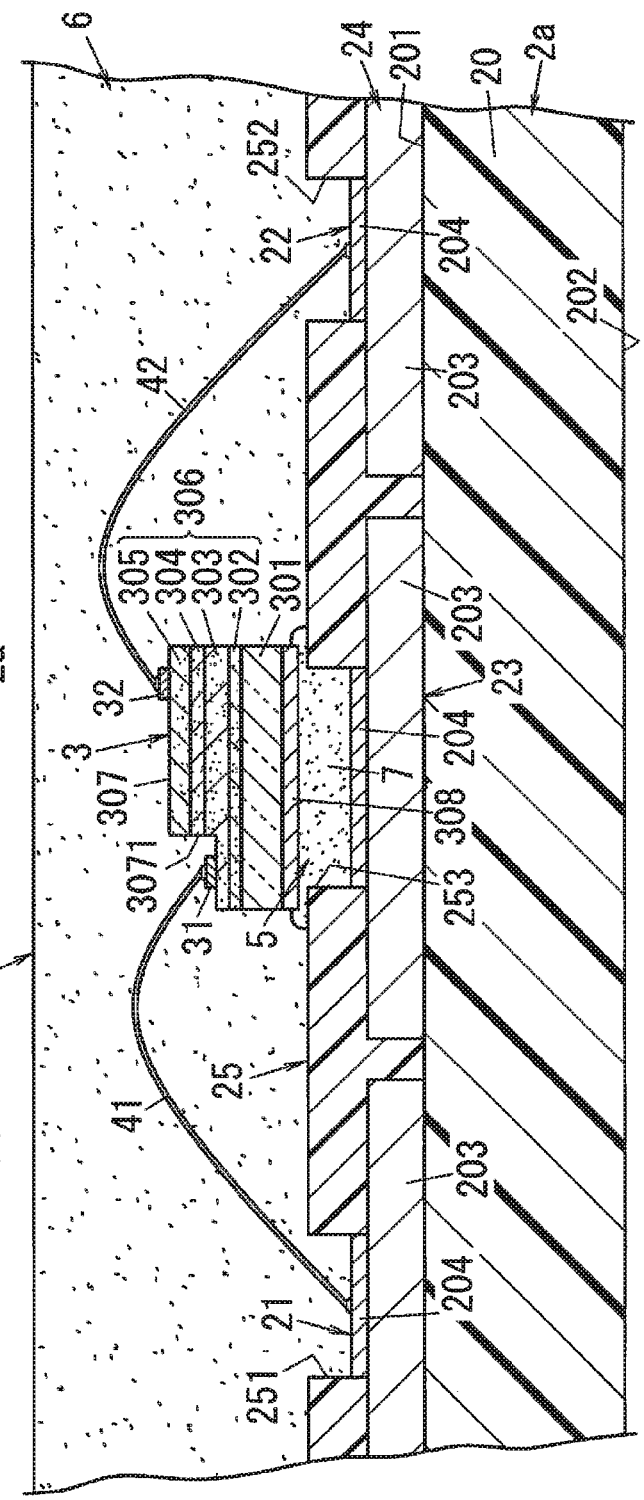
FIG. 2A
FIG. 2B

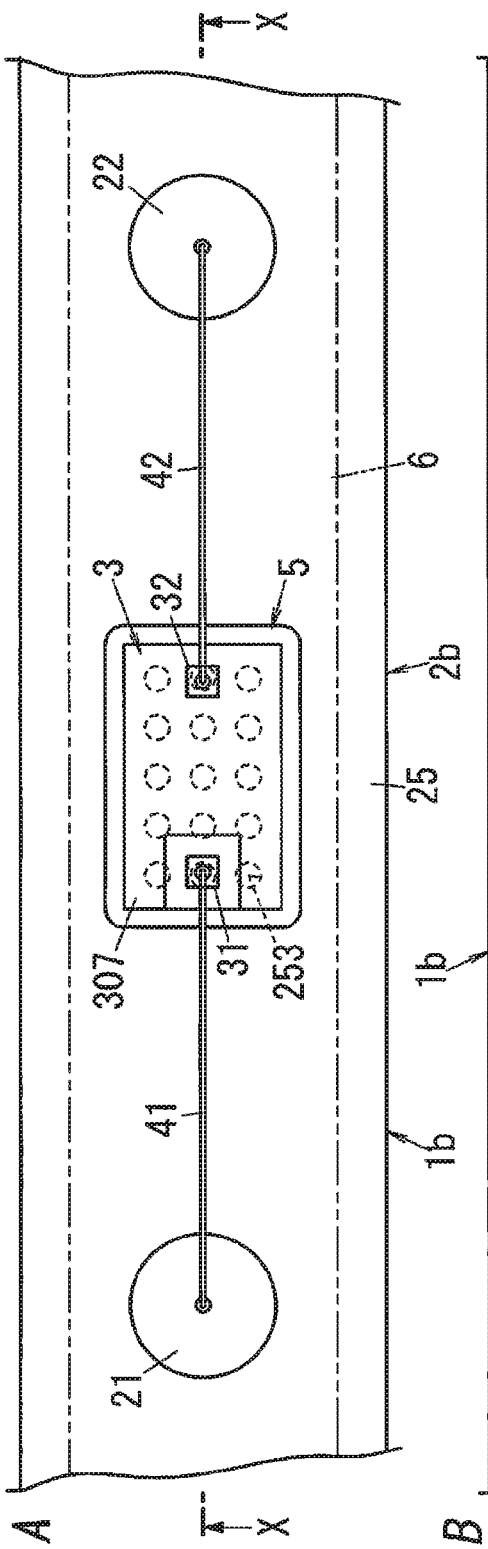
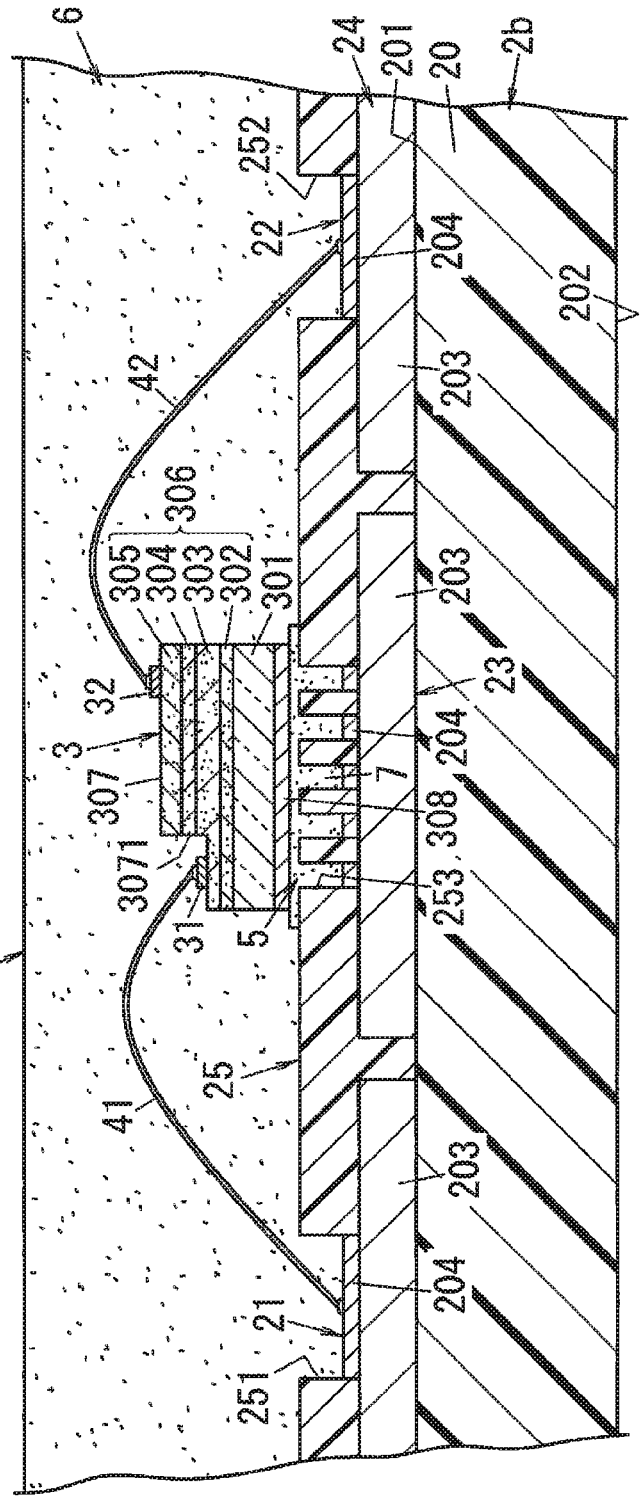
FIG. 3A
FIG. 3B

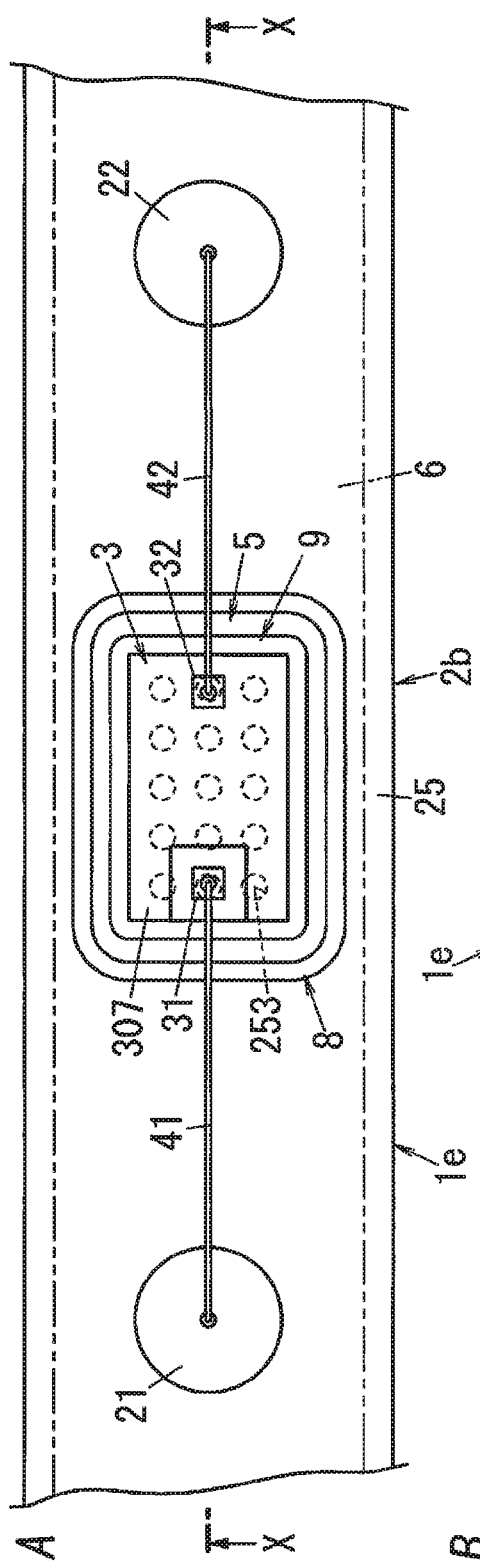
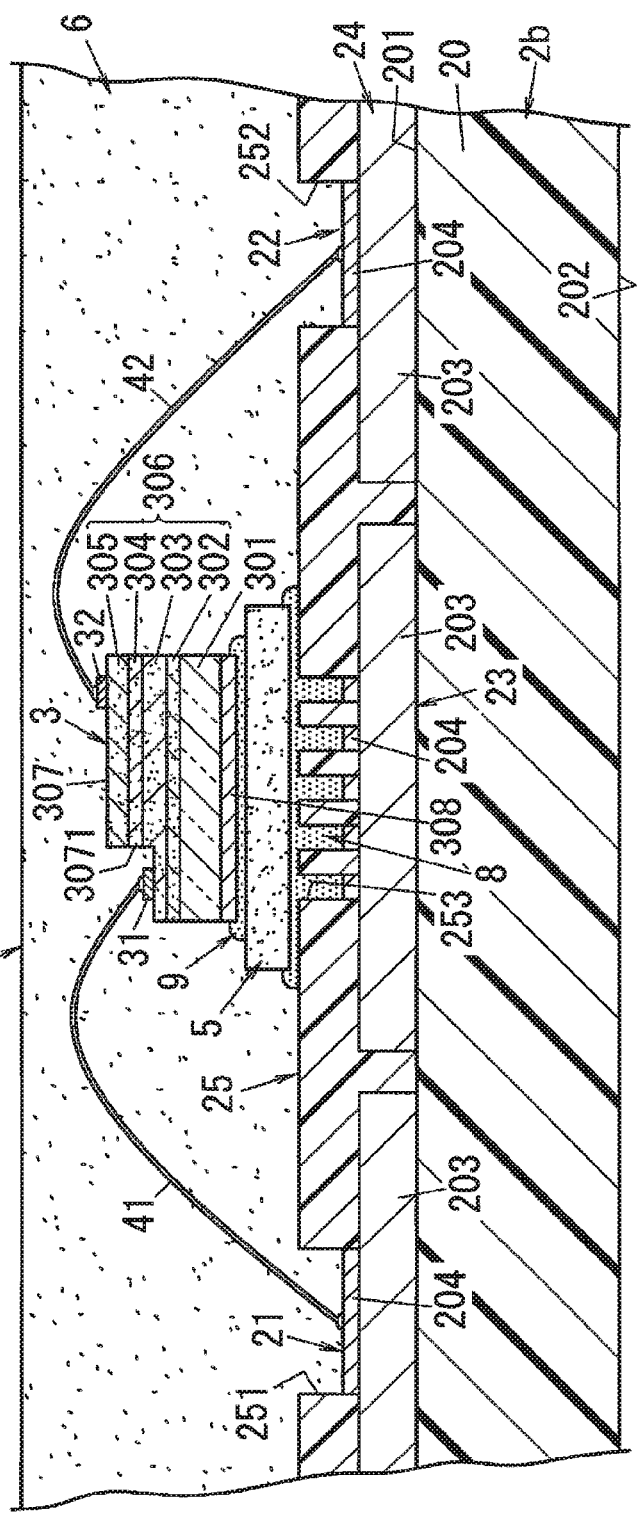
FIG. 6A
FIG. 6B

CHIP ON BOARD TYPE LED MODULE

CROSS-REFERENCE TO RELATED APPLICATIONS

The application is based upon and claims the benefit of priority of Japanese Patent Application No. 2015-042724, filed on Mar. 4, 2015, the entire content of which is incorporated herein by reference.

TECHNICAL FIELD

This disclosure relates to an LED (Light Emitting Diode) module.

BACKGROUND ART

Conventionally, there has been known a COB (Chip On Board) type of LED module (see JP 2014-170947 A (hereinafter referred to as Document 1) and JP 2008-140934 A (hereinafter referred to as Document 2)).

A COB type of LED module in Document 1 includes for example a resin board, an LED chip mounted on a first main surface of the resin board, a metal wiring, an electrode terminal, a resist, and a sealing member that is formed of resin containing phosphor. The metal wiring is formed on the first main surface of the resin board by patterning. The metal material for the metal wiring is copper for example. The resist is formed to cover the entire first main surface of the resin board, except for connection parts of the metal wiring, which are respectively connected with the LED chip and the electrode terminal. The resist is formed of white resin material.

A COB type of LED module in Document 2 includes: a device board; a white reflection layer, which the entire surface of the device board is covered with; a patterned circuit formed on the reflection layer; and an LED chip. The LED chip is bonded to the white reflection layer with an adhesive layer. Document 2 discloses that, for example, a silicone resin-based adhesive may be used as the adhesive layer.

Regarding the COB type of LED module in Document 1, when the LED chip and the resist are directly bonded to each other with an adhesive (die attach material) such as silicone resin, the bonding strength is low and therefore, the bonding reliability is desired to be improved.

Also regarding the COB type of LED module in Document 2, it is surmised that when the LED chip and the reflection layer are directly bonded to each other with an adhesive such as silicone resin, the bonding strength is low and therefore, the bonding reliability is desired to be improved.

SUMMARY

The present disclosure is directed to an LED module, which can improve bonding strength between an LED chip and a mount board, and further reduce light from being absorbed by the mount board.

An LED module of an aspect according to the present disclosure includes a mount board and an LED chip mounted on the mount board. The mount board includes: an insulation substrate that includes resin and glass; a first conductor, a second conductor and a third conductor that are on a surface of the insulation substrate; and a white resist layer that covers the first conductor, the second conductor and the third conductor. The white resist layer is provided with a first opening, a second opening and at least one third opening for exposing the first conductor, the second conductor and the third conductor, respectively. The LED chip is provided with a first electrode and a second electrode, which are disposed on a side of one surface in a thickness direction, of the LED chip. The LED chip is disposed to cover the at least one third opening in planar view. Regarding the LED chip, the first electrode is electrically connected with the first conductor via a first wire, and the second electrode is electrically connected with the second conductor via a second wire. The LED module further includes a wavelength conversion layer disposed between the LED chip and the third conductor in the thickness direction of the LED chip. The wavelength conversion layer includes phosphor particles that are excited by first light emitted from the LED chip to emit second light having wavelengths greater than wavelengths of the first light.

BRIEF DESCRIPTION OF THE DRAWINGS

The figures depict one or more implementations in accordance with the present disclosure, by way of example only, not by way of limitations. In the figures, like reference numerals refer to the same or similar elements.

FIG. 1A is a schematic plan view of an LED module according to Embodiment 1, and FIG. 1B is a schematic sectional view taken along line X-X of FIG. 1A.

FIG. 2A is a schematic plan view of a main part of the LED module according to Embodiment 1, and FIG. 2B is a schematic sectional view taken along line X-X of FIG. 2A.

FIG. 3A is a schematic plan view of a main part of a first variation of the LED module according to Embodiment 1, and FIG. 3B is a schematic sectional view taken along line X-X of FIG. 3A.

FIG. 6A is a schematic plan view of a main part of a variation of the LED module according to Embodiment 2, and FIG. 6B is a schematic sectional view taken along line X-X of FIG. 6A.

DETAILED DESCRIPTION

Figure 4A:
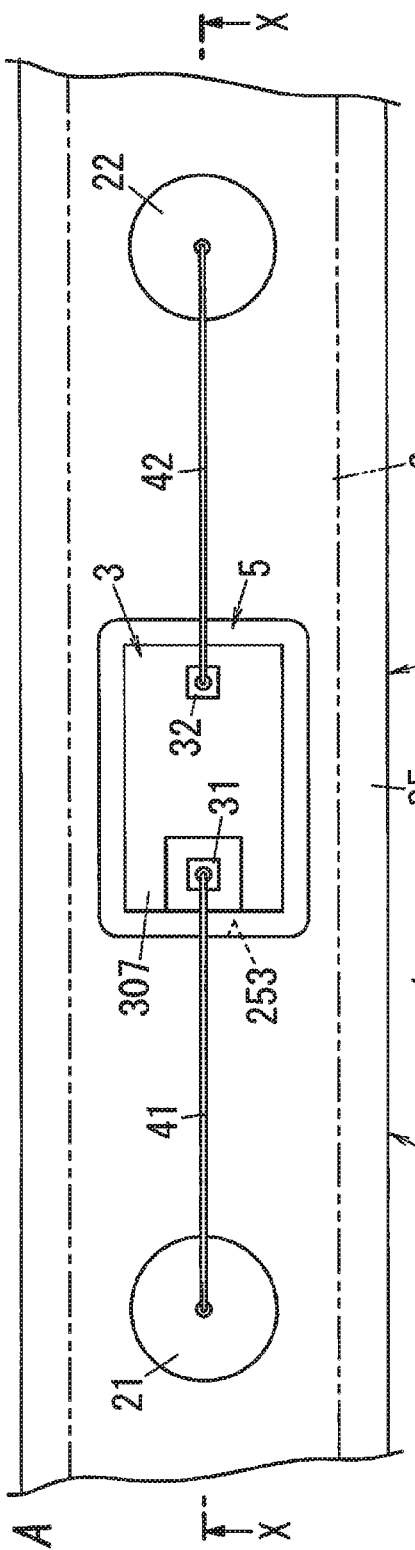
FIG. 4A is a schematic plan view of a main part of a second variation of the LED module according to Embodiment 1.

Embodiments 1 and 2 described below relate generally to LED (Light Emitting Diode) modules, and, more particularly, to a COB (Chip On Board) type of LED module. The figures used for explaining Embodiments 1 and 2 described below are schematic, and a ratio between the sizes of components shown in the figures does not necessarily correspond to an actual ratio.

Embodiment 1

Hereinafter, an LED module 1a of the present embodiment will be explained with reference to FIGS. 1A, 1B, 2A and 2B.

The LED module 1a includes a mount board 2a and (at least) an LED chip 3 mounted on the mount board 2a. The mount board 2a includes: an insulation substrate 20 that includes resin and glass; a first conductor 21, a second conductor 22 and a third conductor 23 that are on a surface 201 of the insulation substrate 20; and a white resist layer 25 that covers the first conductor 21, the second conductor 22 and the third conductor 23. The white resist layer 25 is provided with a first opening 251, a second opening 252 and at least one third opening 253 for exposing the first conductor 21, the second conductor 22 and the third conductor 23, respectively. The LED chip 3 is provided with a first electrode 31 and a second electrode 32, which are disposed on a side of one surface in a thickness direction, of the LED chip 3. The LED chip 3 is disposed to cover the at least one third opening 253 in planar view. Regarding the LED chip 3, the first electrode 31 is electrically connected with the first conductor 21 via a first wire 41, and the second electrode 32 is electrically connected with the second conductor 22 via a second wire 42. The LED module 1a further includes a wavelength conversion layer 5 disposed between the LED chip 3 and the third conductor 23 in the thickness direction of the LED chip 3. The wavelength conversion layer 5 includes phosphor particles that are excited by first light emitted from the LED chip 3 to emit second light having wavelengths (a region) greater than wavelengths (a region) of the first light. Accordingly, the LED module 1a can improve bonding strength between the LED chip 3 and the mount board 2a, and further reduce light from being absorbed by the mount board 2a. In other words, the LED module 1a can improve the mount performance of the LED chip 3 to the mount board 2a, and further reduce light from being absorbed by the mount board 2a. The insulation substrate 20 is a substrate having electric insulation. The white resist layer 25 has both of a function as an electric insulation cover layer that covers the first conductor 21, the second conductor 22 and the third conductor 23, and a function as a reflection layer that reflects visible light. "The LED chip 3 covers the third opening 253 in planar view" means that the LED chip 3 covers the third opening 253, when the LED chip 3 and the mount board 2a are viewed from the side of a surface of the LED chip 3 (i.e., from the above of the LED chip 3 in FIG. 2B) in the thickness direction of the LED chip 3.

The LED module 1a further includes a sealing portion 6 that covers the LED chip 3, the first wire 41 and the second wire 42 on a surface of the mount board 2a. The sealing portion 6 is configured to allow the first light and the second light to transmit. Accordingly, the LED module 1a can improve the reliability. The sealing portion 6 has a function of sealing and protecting the LED chip 3, the first wire 41 and the second wire 42. The sealing portion 6 has electric insulation.

The inventors of the present application found that, in a case of a COB type of LED module described in Document 1, bondability between an LED chip and a resist may be reduced due to combination of materials for the resist and an adhesive. More specifically, the inventors of the present application found that, in a case where the resist is a white resist layer which includes a nitride derived from a polar functional group required for curing of the resist, the bonding strength cannot be sufficiently obtained when using thermosetting silicone-based resin including a platinum catalyst, as an adhesive for bonding the LED chip and the white resist layer. The bonding strength was estimated from die shear strength. The die shear strength is strength required for taking off an LED chip bonded on a mount board from the mount board by pressing in a direction parallel to a bonding face. The die shear strength was measured by a die shear tester.

Furthermore, the inventors of the present application considered that the reason why the bonding strength between the LED chip and the white resist layer cannot be sufficiently obtained is that the platinum catalyst deteriorates due to influence of the nitride included in the white resist layer when the silicone-based resin is heated, and accordingly, curing is inhibited. The inventors of the present application also designed an LED module in which a metal wiring formed of copper is bonded to an LED chip emitting blue light with silicone-based resin. However, regarding this LED module, a reflectivity of the metal wiring with respect to light emitted from the LED chip is less than that of the white resist layer, and therefore, light extraction efficiency is reduced.

On the other hand, the LED module 1a can improve the bondability between the LED chip 3 and the mount board 2a, and further improve the light extraction efficiency.

Hereinafter, components of the LED module 1a will be described in more detail. Note that, for convenience of explanation, the LED chip 3 will be first explained and the mount board 2a will be then explained.

In the present embodiment, the LED chip 3 is a blue LED chip that emits blue light. The LED chip 3 is a GaN-based blue LED chip, and includes a substrate 301, a buffer layer 302, an n-type semiconductor layer 303, a light emitting layer 304 and a p-type semiconductor layer 305. The GaN-based blue LED chip is a nitride-semiconductor light emitting element in which GaN-based material is used as semiconductor material for the light emitting layer 304. Examples of the GaN-based material include GaN, AlGaN, InGaN and the like. The substrate 301 is a sapphire substrate. It is preferable that light emitted from the LED chip 3 have an emission spectrum in which a main light-emitting peak wavelength is in a wavelength region from 440 nm to 480 nm.

In the present embodiment, regarding the LED chip 3, a multilayer film 306 (including the buffer layer 302, the n-type semiconductor layer 303, the light emitting layer 304 and the p-type semiconductor layer 305) is on a surface of the substrate 301. Regarding the LED chip 3, part of the multilayer film 306 is removed by etching the multilayer film 306 from a side of a surface of the multilayer film 306 (i.e., a side of a surface of the p-type semiconductor layer 305) to the middle of the n-type semiconductor layer 303. In other words, the LED chip 3 has a mesa structure 307 formed by etching the part of the multilayer film 306. Accordingly, the LED chip 3 has a level difference 3071 between the surface of the p-type semiconductor layer 305 and an exposed surface of the n-type semiconductor layer 303. Regarding the LED chip 3, the first electrode 31 is on the exposed surface of the n-type semiconductor layer 303, and the second electrode 32 is on the surface of the p-type semiconductor layer 305. Thus, regarding the LED chip 3, the first and second electrodes 31 and 32 are disposed on a side of one surface in a thickness direction, of the LED chip 3, as described above. Regarding the LED chip 3, the first electrode 31 constitutes a negative electrode, and the second electrode 32 constitutes a positive electrode. In other words, regarding the LED chip 3, the respective first and second electrodes 31 and 32 constitute electrodes with polarities different from each other.

The LED chip 3 further includes a DBR (Distributed Bragg Reflector) 308 that is on the backside of the substrate 301. The DBR 308 is designed to reflect light emitted from the light emitting layer 304, and allow light emitted from the phosphor particles of the wavelength conversion layer 5 to transmit.

In the present embodiment, the LED chip 3 has a rectangular shape in planar view. "The shape of the LED chip 3 in planar view" means an outer peripheral shape of the LED chip 3 when viewed from one direction in the thickness direction of the substrate 301, and is the same as an outer peripheral shape of the substrate 301.

In the present embodiment, the mount board 2a is a substrate for mounting (at least) an LED chip 3. In the present embodiment, "mounting" includes meanings of arranging and then mechanically connecting the LED chip 3, and electrically connecting the LED chip 3.

In the present embodiment, two or more LED chips 3 are mounted on the mount board 2a. Accordingly, the LED module 1a can enhance an optical output. In the LED module 1a, as an electric connection form of the two or more LED chips 3, a series connection form is used, where the two or more LED chips 3 are connected in series. Regarding the mount board 2a, the first, second and third conductors 21, 22 and 23 are respectively formed into prescribed patterns, based on the predetermined connection form of the two or more LED chips 3. The mount board 2a is provided with a first terminal 27 and a second terminal 28 for supplying electric power to the LED chip 3, which are on a surface of the insulation substrate 20. The LED module 1a can cause the two or more LED chips 3 to emit light by the electric power being applied between the first and second terminals 27 and 28 from an external power supply device or the like, for example.

In the present embodiment, the mount board 2a has a long shape. The mount board 2a has a long thin rectangular shape in planar view. "The shape of the mount board 2a in planar view" means an outer peripheral shape of the mount board 2a when viewed from one direction in the thickness direction of the mount board 2a. The thickness direction of the mount board 2a is the same as that of each LED chip 3.

The mount board 2a is provided with a printed wiring board 24 that includes the insulation substrate 20, the first conductor 21, the second conductor 22, the third conductor 23, the first terminal 27 and the second terminal 28. The white resist layer 25 is on a surface of the printed wiring board 24.

The first, second and third conductors 21, 22 and 23 and the first and second terminals 27 and 28 are formed with at least conductor foils 203. The conductor foils 203 are metal foils. In the present embodiment, material for the metal foils is copper. Regarding the first, second and third conductors 21, 22 and 23 and the first and second terminals 27 and 28, it is preferable that the conductor foils 203 be provided on surface regions, not covered with the white resist layer 25, with plating layers 204. The plating layers 204 may be formed by an electroless plating method, for example.

Each plating layer 204 has a structure in which a Ni layer, a Pd layer and an Au layer are stacked, as one example. Alternatively, each plating layer 204 may have a structure in which a Ni layer and an Au layer are stacked. Regarding the first, second and third conductors 21, 22 and 23 and the first and second terminals 27 and 28, it is preferable that the outermost layers of the plating layers 204 be configured by Au layers. Accordingly, the LED module 1a can improve oxidation resistance, sulfidation resistance, corrosion resistance and the like more effectively, compared with a case where the outermost layers of the plating layers 204 are configured by Ag layers or a case where the plating layers 204 are not provided.

The printed wiring board 24 is formed of a glass fabric, glass non-woven fabric composite base epoxy resin copper-clad laminate that meets a standard of CEM-3 (Composite Epoxy Materials-3), as one example. In other words, the insulation substrate 20 includes resin and glass, as described above. Accordingly, the insulation substrate 20 can improve thermal conductivity. It is preferable that the thermal conductivity of the insulation substrate 20 be 1 W/m·K or more, for example. The insulation substrate 20 may be a resin-based substrate (organic substrate). The resin-based substrate includes resin as a main component, and a glass base material that serves as a core for forming into a plate shape. The resin may be epoxy resin or polyimide resin, for example. The base material may be glass fabric or glass non-woven fabric, for example. At least parts of the first, second and third conductors 21, 22 and 23 and the first and second terminals 27 and 28 are formed by a conductor foil (copper foil) on the entire surface 201 of the insulation substrate 20 being subjected to patterning to be formed as prescribed patterned conductors.

The white resist layer 25 covers the first, second and third conductors 21, 22 and 23 on a side of the surface 201 of the insulation substrate 20. Since the LED module 1a includes the white resist layer 25, it is possible to improve light extraction efficiency and further enhance an optical output.

It is preferable that the material for the white resist layer 25 be one kind of resist selected from a group of a fluororesin-based white resist, an epoxy resin-based white resist and a silicone resin-based white resist, for example.

When the material for the white resist layer 25 is the fluororesin-based white resist, the white resist layer 25 may be formed by photolithographic technique. When the material for the white resist layer 25 is the epoxy resin-based white resist, the white resist layer 25 may be formed by a printing method. Examples of the printing method include a screen printing method and the like. It is more preferable that the white resist layer 25 be formed of the fluororesin-based white resist. In this case, the LED module 1a can more reduce a change of a reflectivity with time, compared with a case where the white resist layer 25 is formed of the epoxy resin-based white resist or the silicone resin-based white resist.

It is preferable that the at least one third opening 253 be disposed inside an outer peripheral line of the LED chip 3 in planar view. Accordingly, the LED module 1a can improve the bondability between the LED chip 3 and the mount board 2a, and further reduce a light absorption loss from occurring at the third conductor 23 of the mount board 2a.

The mount board 2a may be provided on a back surface 202 of the insulation substrate 20 with a conductor. Accordingly, in the LED module 1a, a warpage of the mount board 2a can be reduced. Therefore, the LED module 1a can reduce stress that transmits from the mount board 2a to the wavelength conversion layer 5 or the LED chip 3, and improve the reliability.

A periphery of part projected from the third opening 253 of the white resist layer 25, of the wavelength conversion layer 5, is disposed over a side edge and a back surface of the LED chip 3. In other words, an edge of the wavelength conversion layer 5 on the side of the LED chip 3 is formed to be larger than the third opening 253, and further larger than the LED chip 3. Accordingly, the LED module 1a can improve the bondability between the LED chip 3 and the mount board 2a, and further heat dissipation.

The wavelength conversion layer 5 includes the above-mentioned phosphor particles, as wavelength conversion material for converting a wavelength of part of the first light emitted from the LED chip 3 so as to emit light having another wavelength. It is preferable that an average particle diameter of the phosphor particles be in a range of 1 μm to 10 μm. As the average particle diameter of the phosphor particles is larger, a defect density is more reduced and an energy loss is also more reduced, and accordingly luminous efficiency tends to be more increased. Therefore, it is preferable that the average particle diameter of the phosphor particles be 5 μm or more in the point of view of the luminous efficiency. In the present embodiment, the average particle diameter of the phosphor particles is an average particle diameter in volume reference, which is measured by a dynamic light scattering method.

Examples of the phosphor particles of the wavelength conversion layer 5 include: yellow phosphor particles of emitting yellow light; yellow-green phosphor particles of emitting yellow-green light; green phosphor particles of emitting green light; red phosphor particles of emitting red light; and the like.

It is preferable that light emitted from the yellow phosphor particles have an emission spectrum in which a main light-emitting peak wavelength is in a wavelength region from 530 nm to 580 nm, for example. The composition of the yellow phosphor particles is for example $SrSi_2O_2N_2$ activated with Eu, or the like.

It is preferable that light emitted from the yellow-green phosphor particles have an emission spectrum in which a main light-emitting peak wavelength is in a wavelength region from 530 nm to 550 nm, for example. The composition of the yellow-green phosphor particles is for example YAG (Yttrium Aluminum Garnet) activated with Ce.

It is preferable that light emitted from the green phosphor particles have an emission spectrum in which a main light-emitting peak wavelength is in a wavelength region from 490 nm to 540 nm, for example. The composition of the green phosphor particles is for example $CaSc_2O_4$ activated with Ce, $Ca_3Sc_2Si_3O_{12}$ activated with Ce, $(Ca,Sr,Ba)Al_2O_4$ activated with Eu, $SrGa_2S_4$ activated with Eu, or the like.

It is preferable that light emitted from the red phosphor particles have an emission spectrum in which a main light-emitting peak wavelength is in a wavelength region from 600 nm to 670 nm, for example. The composition of the red phosphor particles is for example $CaAlSiN_3$ activated with Eu, $(Sr,Ca)AlSiN_3$ activated with Eu, or the like. In other words, the red phosphor particles may be for example CASN, SCASN, or the like The wavelength conversion layer 5 in the LED module 1*a* of the present embodiment also serves as a bonding portion 7 for bonding the LED chip 3 to the mount board 2*a*. Accordingly, regarding the LED module 1*a*, the LED chip 3 and the third conductor 23 of the mount board 2*a* are bonded to each other with the wavelength conversion layer 5. In other words, regarding the LED module 1*a*, the LED chip 3 is mechanically bonded on the mount board 2*a* with the wavelength conversion layer 5. Regarding the LED module 1*a*, since the wavelength conversion layer 5 also serves as the bonding portion 7, the cost can be reduced. In addition regarding the LED module 1*a*, since the wavelength conversion layer 5 also serves as the bonding portion 7, it can be easily manufactured.

It is preferable that the wavelength conversion layer 5 be formed of a mixture of the phosphor particles thereof and silicone-based resin. Accordingly, in the LED module 1*a*, it is possible to improve the bondability between the LED chip 3 and the mount board 2*a*. Furthermore in the LED module 1*a*, it is possible to improve thermal resistance and weather resistance of the wavelength conversion layer 5. The "silicone-based resin" means silicone resin or modified silicone resin.

It is preferable that the first and second wires 41 and 42 be gold wires. Accordingly, the LED module 1*a* can more improve the reliability, compared with a case where the first and second wires 41 and 42 are aluminum wires, for example.

It is preferable that the sealing portion 6 be formed into a lens-shape. Accordingly, the LED module 1*a* can further improve the light extraction efficiency. As one example, the sealing portion 6 is formed into a cylindrical lens-shape. Accordingly in the LED module 1*a*, the light extraction efficiency can be improved, and further color unevenness can be reduced. The "color unevenness" is a state where the chromaticity changes depending on a light emission direction. When the sealing portion 6 is formed into a cylindrical lens-shape, the shape is linear in planar view.

The sealing portion 6 is formed of light-transmitting material. The light-transmitting material may be silicone resin, for example, although not limited to it. Alternatively, fluorine-based resin, melting point glass, sol-gel glass, or the like may be used as the light-transmitting material. It is preferable that the light-transmitting material have a high transmittance with respect to visible light.

It is preferable that the sealing portion 6 include phosphor particles that are excited by the first light to emit third light having wavelengths greater than the wavelengths of the first light. Accordingly, the LED module 1*a* can provide mixed-color light of the first, second and third light. The light source color of the LED module 1*a* is a color of the mixed-color light of the first, second and third light.

Regarding the LED module 1*a*, it is preferable that light emitted from the wavelength conversion layer 5 have an emission spectrum different from an emission spectrum of light emitted from the sealing portion 6. Accordingly, the LED module 1*a* can improve the color rendering properties of the mixed-color light.

Regarding the LED module 1*a*, it is preferable that the second light emitted from the phosphor particles of the wavelength conversion layer 5 have a main light-emitting peak wavelength greater than a main light-emitting peak wavelength of the third light emitted from the phosphor particles of the sealing portion 6. Accordingly, the LED module 1*a* can reduce the possibility that the second light emitted from the phosphor particles of the wavelength conversion layer 5 is absorbed by the phosphor particles of the sealing portion 6, and therefore the light extraction efficiency can be improved.

It is preferable that the phosphor particles of the wavelength conversion layer 5 be red phosphor particles of emitting red light as the second light. Accordingly in the LED module 1*a*, it is possible to more increase a reflectivity of the third conductor 23 with respect to the light emitted from the phosphor particles of the wavelength conversion layer 5. Furthermore, the LED module 1*a* can more reduce the possibility that the second light is absorbed by the phosphor particles of the sealing portion 6, and therefore the light extraction efficiency can be improved. In addition, the LED module 1*a* can improve the color rendering properties of the mixed-color light of the first, second and third light. When the phosphor particles of the sealing portion 6 are red phosphor particles, it is preferable that the phosphor particles of the wavelength conversion layer 5 be yellow, yellow-green or green phosphor particles, for example.

When the LED module 1*a* is used as a light source for general illumination, it is preferable that the light source color of the LED module 1*a* be set based on a correlated color temperature of a light source color of LED, which is defined by JIS (Japanese Industrial Standards) Z9112:2012, for example. In JIS Z9112:2012, the light source color of LED is classified based on the chromaticity of the XYZ colormetric system into five types: a daylight color; a daytime white color; a white color; a warm white color; and an electric bulb color.

The LED module 1a can be applied as light sources of various lighting apparatuses. Examples of the lighting apparatus include a straight tube type of LED lamp, a bulb type of LED lamp, a luminaire and the like. Regarding the straight tube type of LED lamp, it is preferable to meet the standard of "a straight tube type of LED lamp system (for general light purpose) with an L-type pin cap GX16t-5" (JEL 801:2010), which is defined by Japan Lighting Manufactures Association, for example.

In manufacturing of the LED module 1a, the printed wiring board 24 is first prepared, and then first, second, third and fourth processes as below are successively performed.

In the first process, the white resist layer 25 is formed on a surface of the printed wiring board 24.

In the second process, the LED chip 3 that is a die is bonded to the third conductor 23 of the mount board 2a with the wavelength conversion layer 5 (bonding portion 7) by using a die bonding device or the like.

In the third process, the first electrode 31 of each LED chip 3 is electrically connected to the first conductor 21 via the first wire 41, and the second electrode 32 of the LED chip 3 is electrically connected to the second conductor 22 via the second wire 42, by using a wire bonding device or the like. In other words, the wire bonding is performed in the third process.

In the fourth process, the sealing portion 6 is formed by using a dispenser system or the like.

FIG. 3A is a schematic plan view of a main part of an LED module 1b that is a first variation of the LED module 1a. FIG. 3B is a schematic sectional view taken along line X-X of FIG. 3A.

The LED module 1b has a basic configuration similar to that of the LED module 1a, but is different from the LED module 1a in that a mount board 2b is provided instead of the mount board 2a. Note that, regarding the LED module 1b, components similar to those of the LED module 1a are denoted by same signs, and explanations thereof will be omitted.

The mount board 2b has a basic configuration similar to that of the mount board 2a, but is different from the mount board 2a in that two or more third openings 253 are formed directly below the LED chip 3. "Directly below the LED chip 3" means a projection region of the LED chip 3 in the thickness direction of the LED chip 3. Note that, regarding the mount board 2b, components similar to those of the mount board 2a are denoted by same signs, and explanations thereof will be omitted.

Regarding the LED module 1b, the at least one third opening 253 includes two or more third openings 253 and the two or more third openings 253 are formed directly below the LED chip 3, and accordingly, it is possible to improve the bondability between the LED chip 3 and the mount board 2b, and further reduce a light absorption loss from occurring at the third conductor 23 of the mount board 2b.

Figure 4B:
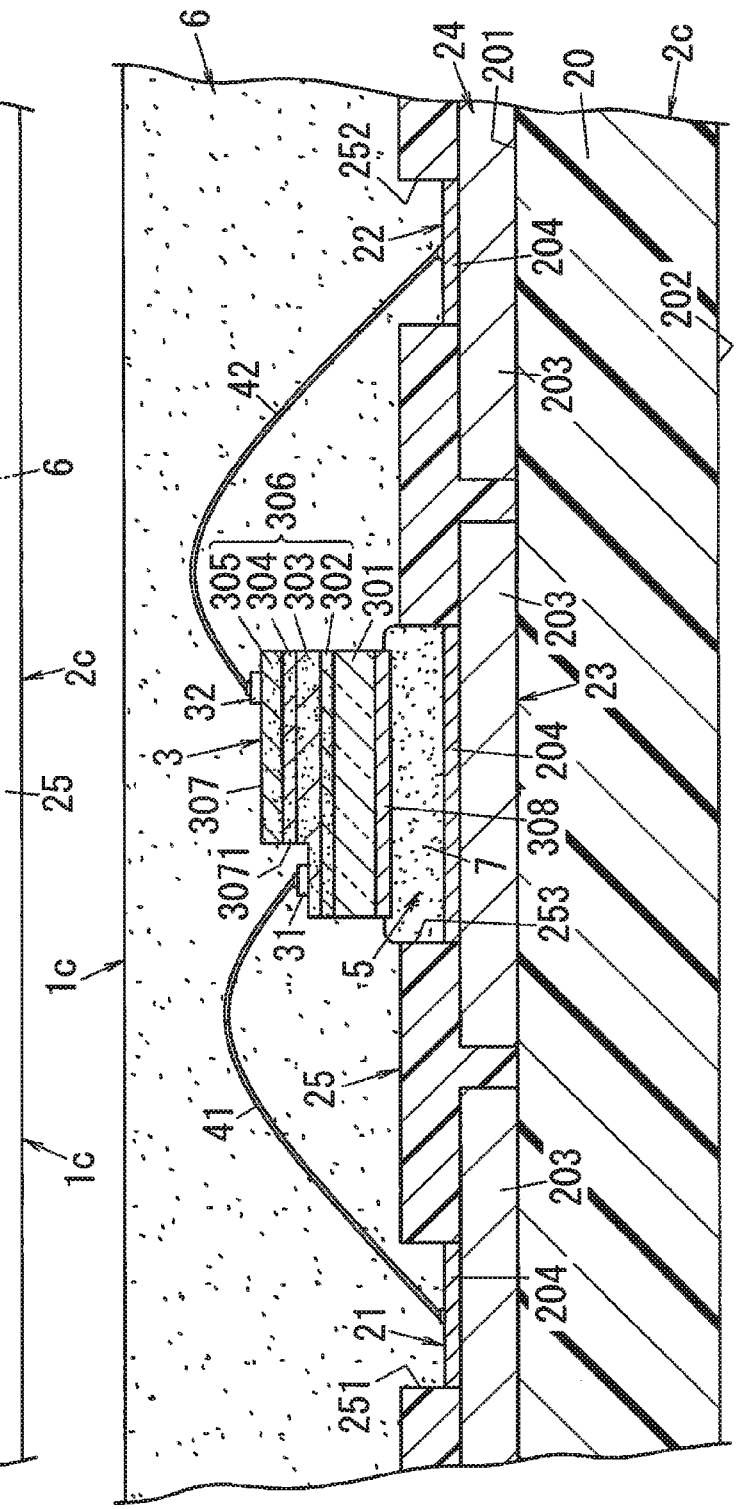
FIG. 4B is a schematic sectional view taken along line X-X of FIG. 4A.

FIG. 4A is a schematic plan view of a main part of an LED module 1c that is a second variation of the LED module 1a. FIG. 4B is a schematic sectional view taken along line X-X of FIG. 4A.

The LED module 1c has a basic configuration similar to that of the LED module 1a, but is different from the LED module 1a in that a mount board 2c is provided instead of the mount board 2a. Note that, regarding the LED module 1c, components similar to those of the LED module 1a are denoted by same signs, and explanations thereof will be omitted.

The mount board 2c is set such that an opening area of a third opening 253 is larger than a chip area of the LED chip 3. More specifically, the third opening 253 is formed such that an outer peripheral line of the LED chip 3 is located inside an inner peripheral line of the third opening 253 in planar view. Accordingly, regarding the LED module 1c, the opening area of the third opening 253 is larger than a back surface area of the LED chip 3.

Regarding the LED module 1c described above, the at least one third opening 253 in the white resist layer 25 has a size larger than a size of the LED chip 3 in planar view. Therefore, the LED module 1c can improve the bondability between the LED chip 3 and the mount board 2c.

Embodiment 2

Figure 5A:
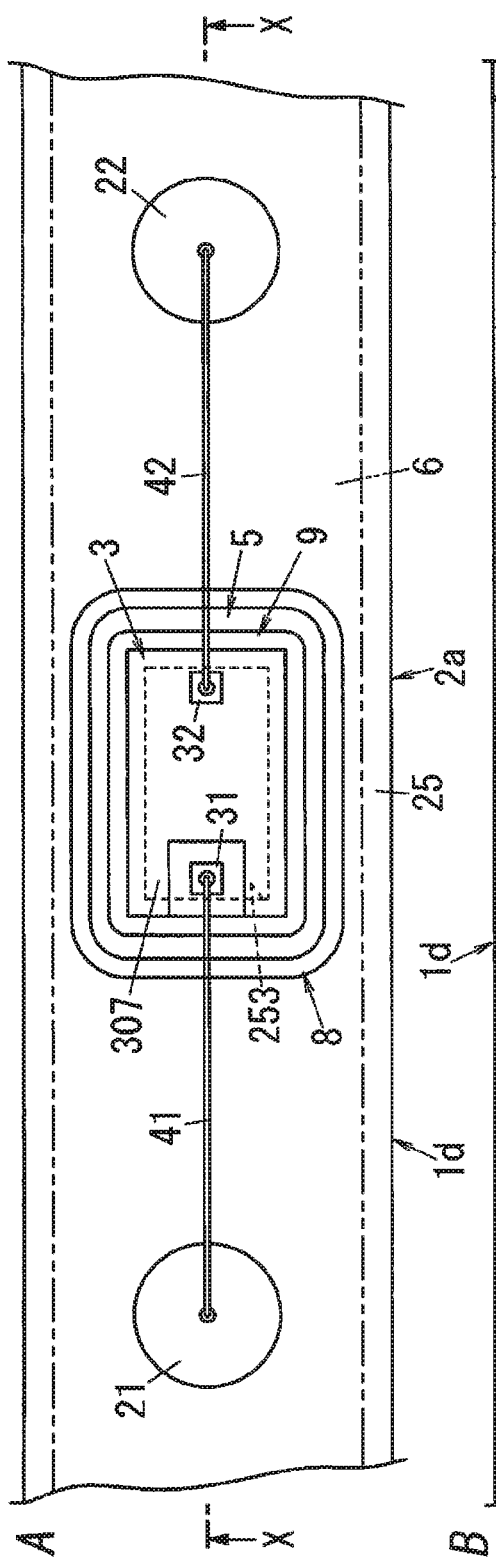
FIG. 5A is a schematic plan view of a main part of an LED module according to Embodiment 2.
Figure 5B:
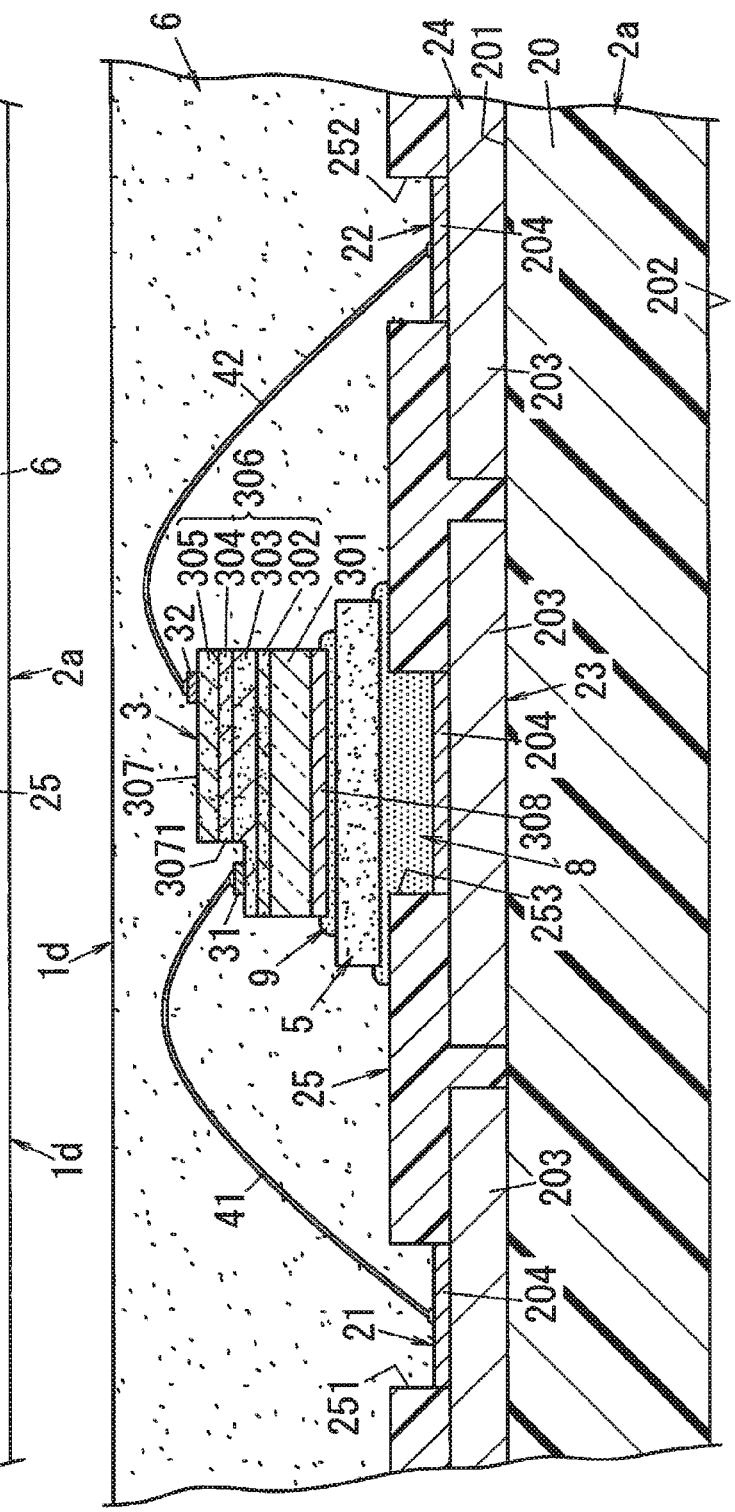
FIG. 5B is a schematic sectional view taken along line X-X of FIG. 5A.

Hereinafter, an LED module 1d of the present embodiment will be explained with reference to FIGS. 5A and 5B. Note that, regarding the LED module 1d, components similar to those of the LED module 1a of Embodiment 1 are denoted by same signs, and explanations thereof will be omitted.

A wavelength conversion layer 5 of the LED module 1d is formed of a mixture of phosphor particles and inorganic binder. Accordingly in the LED module 1d, it is possible to improve thermal resistance and weather resistance of the wavelength conversion layer 5. In the present embodiment, the wavelength conversion layer 5 is a molded product.

The LED module 1d includes a first adhesive layer 8 for causing the wavelength conversion layer 5 to adhere to a third conductor 23; and a second adhesive layer 9 for causing an LED chip 3 to adhere to the wavelength conversion layer 5. The first adhesive layer 8 and the second adhesive layer 9 are formed of light-transmitting material. Accordingly, first light emitted from the LED chip 3, second light emitted from the phosphor particles of the wavelength conversion layer 5 and third light emitted from phosphor particles of a sealing portion 6 can be transmitted through the first adhesive layer 8 and the second adhesive layer 9. Therefore, the LED module 1d can improve bonding strength between the LED chip 3 and a mount board 2a, and further reduce light from being absorbed by the mount board 2a. Furthermore, the LED module 1d can improve the light extraction efficiency.

It is preferable that light-transmitting material of the first adhesive layer 8 and the second adhesive layer 9 have a high transmittance with respect to visible light. It is preferable that the material of the first adhesive layer 8 and the second adhesive layer 9 be silicone-based resin, for example. Accordingly, the LED module 1d can improve the bondability. Examples of the silicone-based resin include thermosetting silicone resin, two-part silicone (two-part curing silicone resin) and photo-curable silicone (photo-curing silicone resin), and the like Note that, although formed of the same material in the present embodiment, the first adhesive layer 8 and the second adhesive layer 9 may be formed of materials different from each other.

FIG. 6A is a schematic plan view of a main part of an LED module 1e that is a variation of the LED module 1d. FIG. 6B is a schematic sectional view taken along line X-X of FIG. 6A.

The LED module 1e has a basic configuration similar to that of the LED module 1d, but is different from the LED module 1*d* in that a mount board 2*b* is provided instead of the mount board 2*a*. Note that, regarding the LED module 1*e*, components similar to those of the LED module 1*d* are denoted by same signs, and explanations thereof will be omitted.

The mount board 2*b* has a basic configuration similar to that of the mount board 2*a*, but is different from the mount board 2*a* in that two or more third openings 253 are formed directly below the LED chip 3. Note that, regarding the mount board 2*b*, components similar to those of the mount board 2*a* are denoted by same signs, and explanations thereof will be omitted.

Regarding the LED module 1*e*, the at least one third opening 253 includes two or more third openings 253 and the two or more third openings 253 are formed directly below the LED chip 3, and accordingly, it is possible to improve the bondability between the LED chip 3 and the mount board 2*b*, and further reduce a light absorption loss from occurring at the third conductor 23 of the mount board 2*b*.

Materials, numeral values and the like described in Embodiments 1 and 2 are preferable examples, and the LED modules of Embodiments 1 and 2 are not limited to such the materials, numeral values and the like. In addition, Embodiments 1 and 2 may be appropriately modified.

For example, the substrate 301 of each LED chip 3 is not limited to a sapphire substrate, and may be a GaN substrate. The multilayer film 306 of each LED chip 3 may have a structure in which the p-type semiconductor layer 305, the light emitting layer 304 and the n-type semiconductor layer 303 are stacked in this order from a surface side of the substrate 301. Alternatively, the multilayer film 306 may have a structure in which the n-type semiconductor layer 303 and the p-type semiconductor layer 305 are stacked. Each LED chip 3 may be not provided with the DBR 308 that is on the backside of the substrate 301.

The shapes of the mount boards 2*a* to 2*c* in planar view are not limited to long thin rectangles, and may be rectangles, squares or circles.

Regarding each of the LED modules 1*a* to 1*e*, a connection form may be used, where two or more LED chips 3 are connected in series and in parallel, or connected in parallel.

Regarding each of the LED modules 1*a* to 1*e*, only a single LED chip 3 may be mounted on the mount board (2*a*, 2*b* or 2*c*). The shapes of the mount boards 2*a* to 2*c* in planar view may be appropriately modified according to the number and the arrangement of the LED chips 3. Also, the shape of the sealing portion 6 may be appropriately modified according to the number and the arrangement of the LED chips 3.

As apparent from Embodiments 1 and 2 described above, an LED module (1*a* to 1*e*) of a first aspect according to the present disclosure includes a mount board (2*a*, 2*b*, 2*c*) and an LED chip (3) mounted on the mount board (2*a*, 2*b*, 2*c*). The mount board (2*a*, 2*b*, 2*c*) includes: an insulation substrate (20) that includes resin and glass; a first conductor (21), a second conductor (22) and a third conductor (23) that are on a surface (201) of the insulation substrate (20); and a white resist layer (25) that covers the first conductor (21), the second conductor (22) and the third conductor (23). The white resist layer (25) is provided with a first opening (251), a second opening (252) and at least one third opening (253) for exposing the first conductor (21), the second conductor (22) and the third conductor (23), respectively. The LED chip (3) is provided with a first electrode (31) and a second electrode (32), which are disposed on a side of one surface in a thickness direction, of the LED chip (3). The LED chip (3) is disposed to cover the at least one third opening (253) in planar view. Regarding the LED chip (3), the first electrode (31) is electrically connected with the first conductor (21) via a first wire (41), and the second electrode (32) is electrically connected with the second conductor (22) via a second wire (42). The LED module (1*a* to 1*e*) further includes a wavelength conversion layer (5) disposed between the LED chip (3) and the third conductor (23) in the thickness direction of the LED chip (3). The wavelength conversion layer (5) includes phosphor particles that are excited by first light emitted from the LED chip (3) to emit second light having wavelengths greater than wavelengths of the first light.

An LED module (1*a* to 1*e*) of a second aspect according to the present disclosure, in the first aspect, further includes a sealing portion (6) that covers the LED chip (3), the first wire (41) and the second wire (42) on a surface of the mount board (2*a*, 2*b*, 2*c*). The sealing portion (6) is configured to allow the first light and the second light to transmit.

Regarding an LED module (1*a* to 1*e*) of a third aspect according to the present disclosure, in the second aspect, the sealing portion (6) includes phosphor particles that are excited by the first light to emit third light having wavelengths greater than the wavelengths of the first light.

Regarding an LED module (1*a* to 1*e*) of a fourth aspect according to the present disclosure, in the third aspect, light emitted from the wavelength conversion layer (5) has an emission spectrum different from an emission spectrum of light emitted from the sealing portion (6).

Regarding an LED module (1*a* to 1*e*) of a fifth aspect according to the present disclosure, in the fourth aspect, the second light emitted from the phosphor particles of the wavelength conversion layer (5) has a main light-emitting peak wavelength greater than a main light-emitting peak wavelength of the third light emitted from the phosphor particles of the sealing portion (6).

Regarding an LED module (1*a* to 1*e*) of a sixth aspect according to the present disclosure, in the fifth aspect, the phosphor particles of the wavelength conversion layer (5) are red phosphor particles of emitting red light as the second light.

Regarding an LED module (1*b*, 1*e*) of a seventh aspect according to the present disclosure, in any one of the first to sixth aspects, the at least one third opening (253) includes two or more third openings (253), and the two or more third openings (253) are formed directly below the LED chip (3).

Regarding an LED module (1*a*, 1*b*, 1*d*, 1*e*) of an eighth aspect according to the present disclosure, in any one of the first to seventh aspects, the at least one third opening (253) is disposed inside an outer peripheral line of the LED chip (3) in planar view.

Regarding an LED module (1*c*) of a ninth aspect according to the present disclosure, in the first aspect, the at least one third opening (253) has a size larger than a size of the LED chip (3) in planar view.

Regarding an LED module (1*a* to 1*e*) of a tenth aspect according to the present disclosure, in any one of the first to ninth aspects, the wavelength conversion layer (5) also serves as a bonding portion (7) for bonding the LED chip (3) to the mount board (2*a*, 2*b*, 2*c*).

Regarding an LED module (1*a* to 1*e*) of an eleventh aspect according to the present disclosure, in the tenth aspect, the wavelength conversion layer (5) is formed of a mixture of the phosphor particles thereof and silicone-based resin.

An LED module (1*a* to 1*e*) of a twelfth aspect according to the present disclosure, in any one of the first to eighth aspects, further includes: a first adhesive layer (8) for causing the wavelength conversion layer (5) to adhere to the third conductor (23); and a second adhesive layer (9) for causing the LED chip (3) to adhere to the wavelength conversion layer (5). The first adhesive layer (8) and the second adhesive layer (9) are formed of light-transmitting material.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

The invention claimed is:

1. An LED module comprising:
a mount board including:
an insulation substrate,
and a conductor on a surface of the insulation substrate, and
a white resist layer that covers an upper surface of the conductor, the white resist layer having an opening so as to expose a portion of the upper surface of the conductor from the white resist layer; and
an LED chip mounted on the mount board; and
a wavelength conversion layer including phosphor particles that are excited by first light emitted from the LED chip to emit second light having wavelengths greater than wavelengths of the first light, the wavelength conversion layer disposed between the LED chip and the conductor in a thickness direction of the LED chip, and being configured to fill in the opening,
wherein the opening is formed inside an outer peripheral line of the LED chip in planar view, and
a periphery of a part of the wavelength conversion layer projecting from the opening of the white resist layer is disposed over a side edge and a back surface of the LED chip.

2. The LED module according to claim 1, further comprising a sealing member that covers the LED chip, the sealing member being configured to allow the first light and the second light to transmit.

3. The LED module according to claim 2, wherein the sealing member includes phosphor particles that are excited by the first light to emit third light having wavelengths greater than the wavelengths of the first light.

4. The LED module according to claim 3, wherein light emitted from the wavelength conversion layer has an emission spectrum different from an emission spectrum of light emitted from the sealing member.

5. The LED module according to claim 4, wherein the second light emitted from the phosphor particles of the wavelength conversion layer has a main light-emitting peak wavelength greater than a main light-emitting peak wavelength of the third light emitted from the phosphor particles of the sealing member.

6. The LED module according to claim 5, wherein the phosphor particles of the wavelength conversion layer are red phosphor particles of emitting red light as the second light.

7. The LED module according to claim 1, wherein the white resist layer has a plurality of openings directly below the LED chip.

8. The LED module according to claim 1, wherein the wavelength conversion layer also serves as a bonding portion for bonding the LED chip to the mount board.

9. The LED module according to claim 8, wherein the wavelength conversion layer is formed of a mixture of the phosphor particles thereof and silicone-based resin.

10. The LED module according to claim 1, further comprising:
a first adhesive layer for causing the wavelength conversion layer to adhere to the conductor; and
a second adhesive layer for causing the LED chip to adhere to the wavelength conversion layer,
the first adhesive layer and the second adhesive layer being formed of light-transmitting material.

11. The LED module according to claim 1, wherein the opening in the white resist layer is formed below the LED chip in planar view.

* * * * *